United States Patent
Kim et al.

(10) Patent No.: US 7,496,808 B2
(45) Date of Patent: Feb. 24, 2009

(54) PARALLEL BIT TEST CIRCUIT IN SEMICONDUCTOR MEMORY DEVICE AND ASSOCIATED METHOD

(75) Inventors: Young-Suk Kim, Gyeonggi-do (KR); Mahn-Joong Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 426 days.

(21) Appl. No.: 11/149,907

(22) Filed: Jun. 10, 2005

(65) Prior Publication Data

US 2005/0289412 A1 Dec. 29, 2005

(30) Foreign Application Priority Data

Jun. 12, 2004 (KR) .................. 10-2004-0043264

(51) Int. Cl.
*G11C 29/00* (2006.01)

(52) U.S. Cl. .................. 714/718; 714/735; 714/789; 365/201; 324/210

(58) Field of Classification Search .............. 714/735, 714/718, 724, 789; 365/201; 324/210
See application file for complete search history.

(56) References Cited

U.S. PATENT DOCUMENTS

| | | | | |
|---|---|---|---|---|
| 5,416,741 A | * | 5/1995 | Ohsawa | 365/201 |
| 5,646,897 A | * | 7/1997 | Yukutake et al. | 365/205 |
| 5,809,225 A | * | 9/1998 | Ohsawa et al. | 714/32 |
| 5,892,721 A | * | 4/1999 | Kim | 365/201 |
| 5,991,903 A | | 11/1999 | Shin et al. | |
| 6,064,601 A | * | 5/2000 | Yoo et al. | 365/189.04 |
| 6,636,998 B1 | * | 10/2003 | Lee et al. | 714/735 |
| 6,662,315 B1 | * | 12/2003 | Gradinariu et al. | 714/42 |
| 6,853,597 B2 | * | 2/2005 | Jain | 365/201 |
| 6,909,650 B2 | * | 6/2005 | Ryu et al. | 365/201 |
| 6,968,483 B2 | * | 11/2005 | Hartmann | 714/719 |

FOREIGN PATENT DOCUMENTS

| JP | EP0615252 | * | 1/1994 |
|---|---|---|---|
| JP | 10-10204 | | 1/1998 |
| JP | 2002-260398 | | 9/2002 |

OTHER PUBLICATIONS

English language abstract of the Japanese Publication No. 10-10204.
English language abstract of the Japanese Publication No. 2002-260398.

* cited by examiner

*Primary Examiner*—Esaw T Abraham
(74) *Attorney, Agent, or Firm*—Marger Johnson & McCollom, P.C.

(57) ABSTRACT

An embodiment is a circuit including $2^{n-1}$ first comparators to generate a first result by comparing data from at least two of $2^n$ memory cells to which test pattern data are written. $2^{n-1}$ first switching circuits provide the first result or a disable signal responsive to a first switching signal. And $2^{n-2}$ second comparators generate a second result by comparing signals output from some of the $2^{n-1}$ first switching circuits. N may be a natural number greater than or equal to three.

11 Claims, 12 Drawing Sheets

|   | MRS_ADDR[0:3] | OUTPUT |
|---|---|---|
| 1 | 1 1 1 1 | OUTPUT OF THE COMPARATOR 131 |
| 2 | 1 1 0 1 | OUTPUT OF THE COMPARATOR 122 |
| 3 | 1 1 1 0 | OUTPUT OF THE COMPARATOR 121 |
| 4 | 1 0 0 1 | OUTPUT OF THE COMPARATOR 114 |
| 5 | 0 1 0 1 | OUTPUT OF THE COMPARATOR 113 |
| 6 | 1 0 1 0 | OUTPUT OF THE COMPARATOR 112 |
| 7 | 0 1 1 0 | OUTPUT OF THE COMPARATOR 111 |
| 8 | 0 0 0 0 | '0' (TSET MODE FOR THE SWITCHING CIRCUITS) |

PARALLEL BIT TEST CIRCUIT IN SEMICONDUCTOR MEMORY DEVICE AND ASSOCIATED METHOD

PRIORITY CLAIM

This application claims priority to Korean Patent Application No. 2004-43264 filed on Jun. 12, 2004. We incorporate this application by reference.

BACKGROUND

1. Field

Embodiments of this invention relate to a semiconductor memory device and, more particularly, to a semiconductor memory device having a parallel bit test circuit and an associated method.

2. Related Art

A semiconductor memory device performs a parallel bit test responsive to a test mode setting command. The semiconductor memory device then writes test pattern data from a tester to a memory cell array responsive to a write command. Afterwards, the semiconductor memory device reads data from the memory cell array, compares the two data read from the memory cell array, and outputs a compared result. For example, the semiconductor memory device writes a logic '1' into a first pair of memory cells, a logic '0' into second pair of the memory cells, a logic '0' into a third pair of the memory cells and a logic '1' into a forth pair of the memory cells. The semiconductor memory device then reads eight memory cells and compares two data from each of four pairs of memory cells. The semiconductor memory device generates a 'pass' test result when the two data from each of four pairs of memory cells are logically identical. The semiconductor memory device generates a 'fail' test result when two data from any pair of the four pairs of the memory cells are not logically identical.

Figure 1:
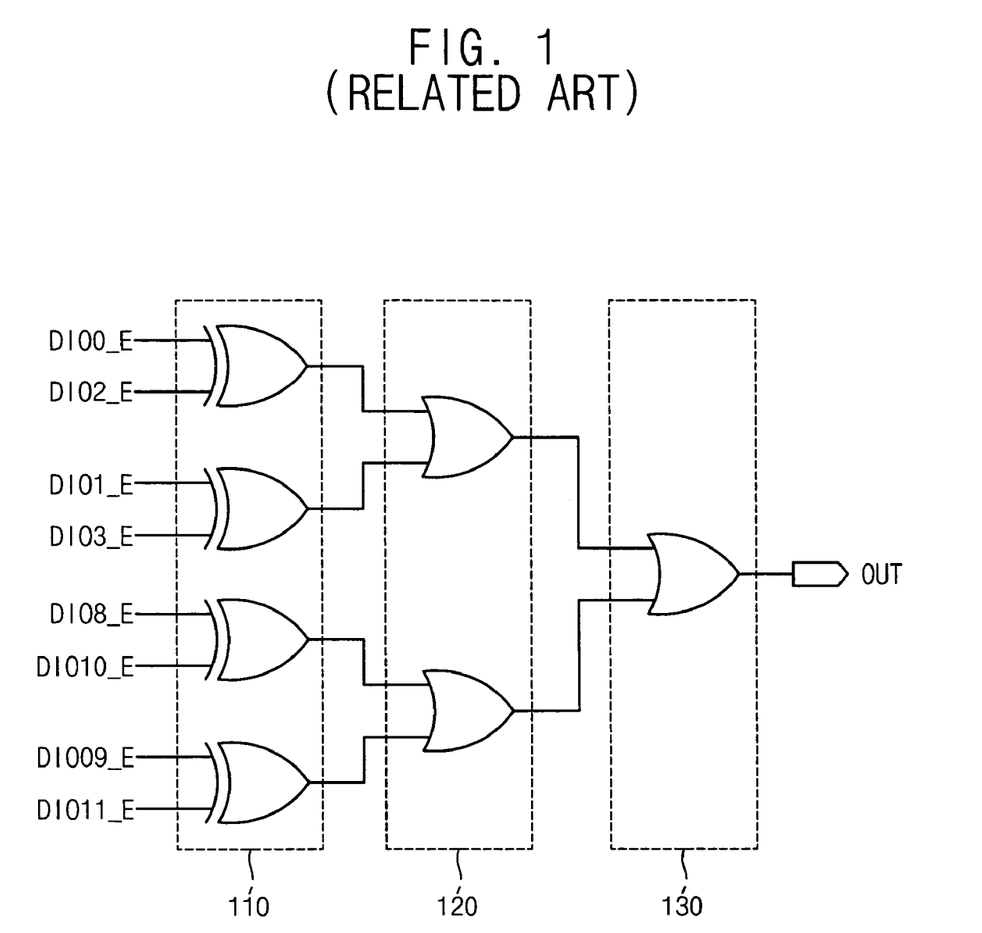
FIG. 1 is a circuit diagram of a parallel bit test circuit.

FIG. 1 is a circuit diagram of a parallel bit test circuit in a semiconductor memory device. Referring to FIG. 1, three comparing circuits 110, 120 and 130 compare data, e.g., eight data bits, from eight memory cells. The parallel bit test circuit outputs the result of the comparison through a pin OUT. The first comparing circuit 110 may have four comparators, e.g., exclusive-OR (XOR) gates. The second comparing circuit 120 may have two comparators, e.g., OR gates. The third comparing circuit 130 may have a comparator, e.g., an OR gate.

The parallel bit test circuit illustrated in FIG. 1 outputs a logic '1' when two data read operations from any of the four pairs of the memory cells are not logically identical.

Figure 2A:
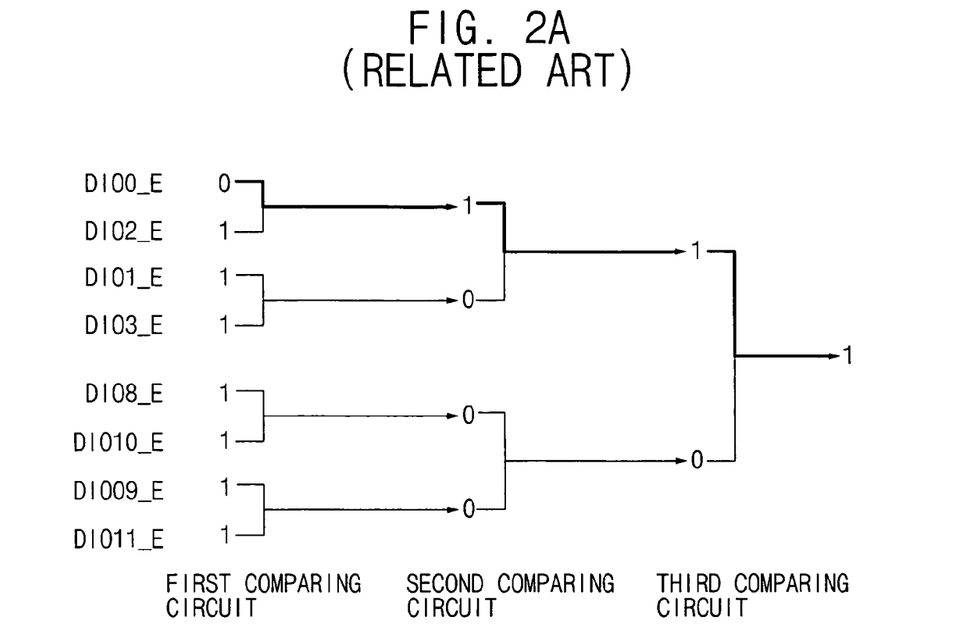
FIG. 2A is a conceptual diagram of a disadvantage associated with the parallel bit test circuit of FIG. 1.
Figure 2B:
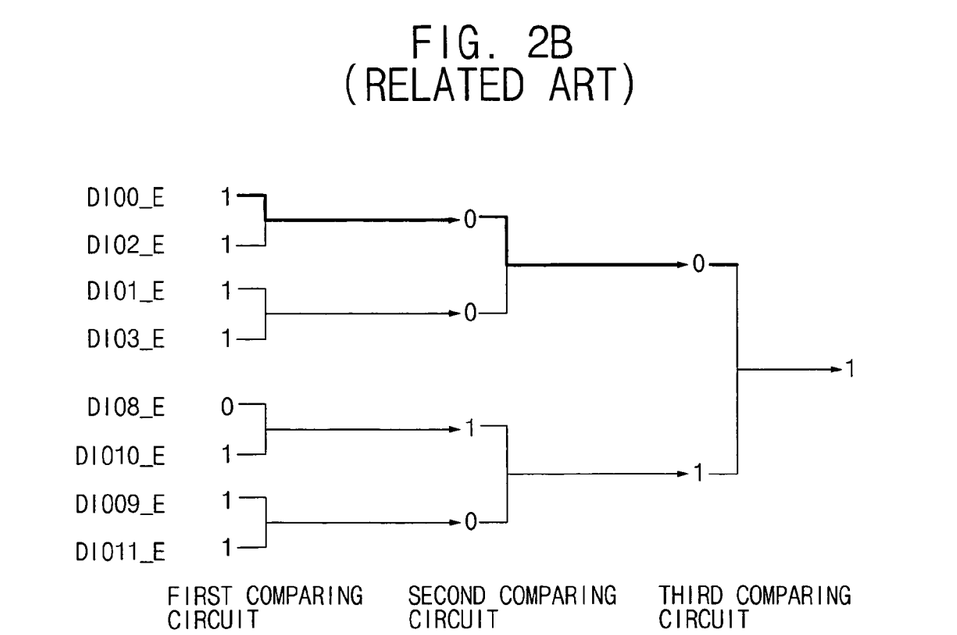
FIG. 2B is a conceptual diagram of an embodiment of a disadvantage associated with the parallel bit test circuit of FIG. 1.

FIG. 2A is a conceptual diagram illustrating a disadvantage associated with the parallel bit test circuit of FIG. 1. FIG. 2A illustrates the case that logic '1's are written in eight memory cells and data are read from the eight memory cells. Referring to FIG. 2A, when the data from the memory cell DIO0_E is read incorrectly, the first comparing circuit outputs are not all logic '0's and the result of the parallel bit test is a logic '1'. The logic '1' of the parallel bit test result means the memory cells failed. The tester cannot identify which memory cell of the eight memory cells tested is the failed memory cell. And the tester cannot quantify how many memory cells failed. FIG. 2B is a conceptual diagram illustrating a disadvantage associated with the parallel bit test circuit of FIG. 1. FIG. 2B illustrates the case where "0111" patterns are written into eight cells and data are read from the eight memory cells. Referring to FIG. 2B, when data from the memory cell DIO0_E is read incorrectly, the first comparing circuit outputs a logic '0' as a result of comparing two data from two cells DIO0_E and DIO2_E. The result of comparing two data from two cells DIO0_E and DIO2_E cancel out because of the third comparing circuit. The tester receiving the result of the parallel bit test will not detect the defective or failed memory cell.

As shown in FIGS. 1, 2A, and 2B, the parallel bit test circuit is incapable of using various test patterns. For example, the conventional parallel bit test circuit cannot use the "0111" pattern. And the parallel bit test circuit cannot identify which memory cell fails and how many memory cells fail.

SUMMARY

An embodiment is a circuit comprising $2^{n-1}$ first comparators to generate a first result by comparing data from at least two of $2^n$ memory cells to which test pattern data are written. $2^{n-1}$ first switching circuits provide the first result or a disable signal responsive to a first switching signal. And $2^{n-2}$ second comparators generate a second result by comparing signals output from some of the $2^{n-1}$ first switching circuits. N may be a natural number greater than or equal to three.

Another embodiment is a test method comprising comparing data from at least two of a plurality of memory cells to which test pattern data are written to generate a first result, providing the first result or a disable signal responsive to a first switching signal, and comparing some first switched signals with other first switched signals to generate second results.

Another embodiment is a test circuit comprising a plurality of first comparators to generate first results by comparing data from a plurality of memory cells to which test pattern data are written. A plurality of first switching circuits provides one of the first results or a disable signal responsive to a first switching signal. And a plurality of second comparators generates second results by comparing signals output from the plurality of first switching circuits, the second comparators generating second results regardless of the first results of a first switching circuit that provides the disable signal.

BRIEF DRAWINGS DESCRIPTION

Embodiment features and advantages will become more apparent with reference to the following drawings.

DETAILED DESCRIPTION

We detail exemplary embodiments shown below. Specific structural and functional details are merely exemplary and should not be construed as limiting. Embodiments may take on alternate forms and still come within the scope of claims. The description is susceptible to various modifications and alternative forms. It should be understood, however, that there is no intent to limit the claims to the particular forms disclosed. The claims cover all modifications, equivalents, and alternatives falling within the spirit and scope of the claims. Like numbers refer to like elements throughout the description of the figures.

Figure 3:
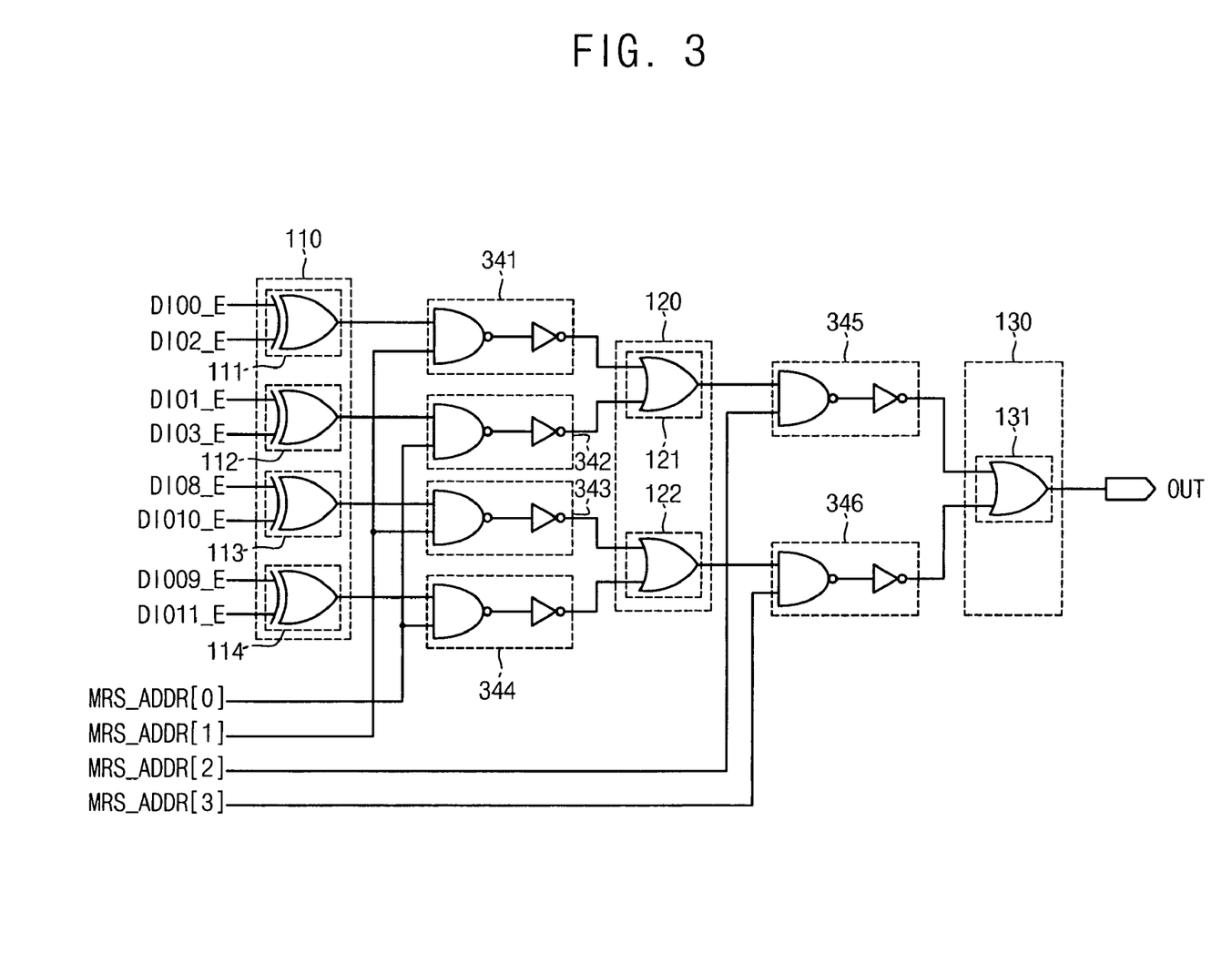
FIG. 3 is a circuit diagram of an embodiment of a parallel bit test circuit.

FIG. 3 is a circuit diagram of an embodiment of a parallel bit test circuit in a semiconductor memory device. As shown in FIG. 3, the parallel bit test circuit includes comparing circuits 110, 120, and 130 and switching circuits 341, 342, 343, 344, 345, and 346. The comparing circuits 110, 120, and 130 in FIG. 3 are similar to the comparing circuits 110, 120, and 130 shown in FIG. 1.

The comparing circuit 110 may have four comparators 111, 112, 113, and 114, e.g., exclusive-OR (XOR) gates. The comparing circuit 120 may have two comparators 121 and 122, e.g., OR gates, and the comparing circuit 130 may have a comparator 131, e.g., an OR gate.

Each of the comparators 111, 112, 113 and 114 outputs a logic '1' when data inputted to each of the comparators 111, 112, 113, and 114 are not logically identical each other. Each of the comparators 121, 122, and 131 outputs a logic '1' when any of data is a logic '1'. As shown in FIG. 3, eight data read from eight memory cells DIO0_E, DIO2_E, DIO1_E, DIO3_E, DIO8_E, DIO10_E, DIO9_E and DIO11_E are inputted to the comparators 111, 112, 113 and 114.

Each of the switching circuits 341, 342, 343, 344, 345 and 346 may have a NAND gate and an inverter serially connected to the NAND gate.

The switching circuit 341 outputs the output signal of the comparator 111 when a switching signal MRS_ADDR[1] has a logic '1'. The switching circuit 341 outputs a disable signal, for example a logic '0', regardless of the output signal of the comparator 111 when the switching signal MRS_ADDR[1] has the logic '0' so that the output signal of the comparator 111 cannot affect the next comparing stages.

The switching circuit 342 outputs the output signal of the comparator 112 when a switching signal MRS_ADDR[0] has a logic '1'. The switching circuit 342 outputs the disable signal, for example a logic '0', regardless of the output signal of the comparator 112 when the switching signal MRS_ADDR[0] has the logic '0' so that the output signal of the comparator 112 cannot affect the next comparing stages.

The switching circuit 343 outputs the output signal of the comparator 113 when a switching signal MRS_ADDR[1] has a logic '1'. The switching circuit 343 outputs the disable signal, for example a logic '0', regardless of the output signal of the comparator 113 when the switching signal MRS_ADDR[1] has the logic '0' so that the output signal of the comparator 113 cannot affect the next comparing stages.

The switching circuit 344 outputs the output signal of the comparator 114 when a switching signal MRS_ADDR[0] has a logic '1'. The switching circuit 344 outputs the disable signal, for example a logic '0', regardless of the output signal of the comparator 114 when the switching signal MRS_ADDR[0] has the logic '0' so that the output signal of the comparator 114 cannot affect the next comparing stages.

The switching circuit 345 outputs the output signal of the comparator 121 when a switching signal MRS_ADDR[2] has a logic '1'. The switching circuit 345 outputs the disable signal, for example a logic '0', regardless of the output signal of the comparator 121 when the switching signal MRS_ADDR[2] has the logic '0' so that the output signal of the comparator 121 cannot affect the next comparing stages.

The switching circuit 346 outputs the output signal of the comparator 122 when a switching signal MRS_ADDR[3] has a logic '1'. The switching circuit 346 outputs the disable signal, for example a logic '0', regardless of the output signal of the comparator 122 when the switching signal MRS_ADDR[3] has the logic '0' so that the output signal of the comparator 122 cannot affect the next comparing stages.

Figure 4:
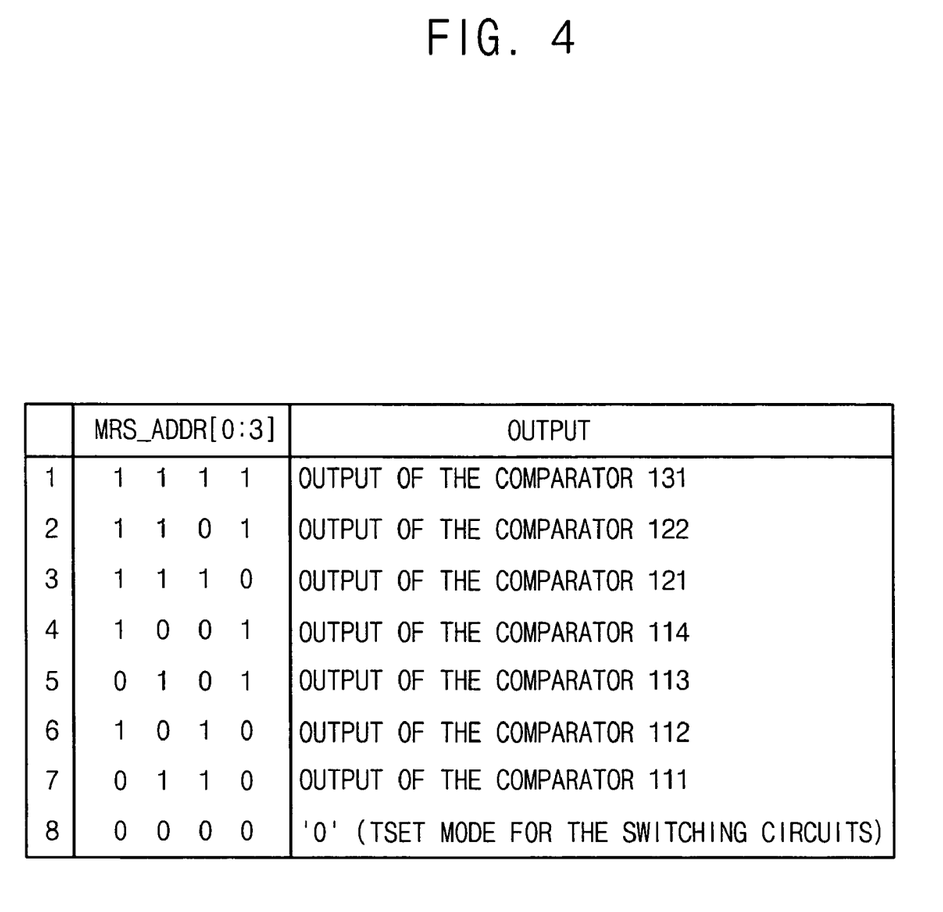
FIG. 4 is a table illustrating operation of the parallel bit test circuit shown in FIG. 3.

FIG. 4 is a table illustrating operation of the parallel bit test circuit shown in FIG. 3. Referring to FIGS. 3 and 4, the comparator 131 outputs through a node OUT when the switching signals MRS_ADDR[0], MRS_ADDR[1], MRS_ADDR[2] and MRS_ADDR[3] all have logic '1's.

The comparator 122 outputs through the node OUT when the switching signal MRS_ADDR[2] has a logic '0' and the switching signals MRS_ADDR[0], MRS_ADDR[1] and MRS_ADDR[3] all have logic '1's. The comparator 121 outputs through the node OUT when the switching signal MRS_ADDR[3] has a logic '0' and the switching signals MRS_ADDR[0], MRS_ADDR[1] and MRS_ADDR[2] all have logic '1's.

The comparator 114 outputs through the node OUT when the switching signals MRS_ADDR[1] and MRS_ADDR[2] have logic '0's and the switching signals MRS_ADDR[0] and MRS_ADDR[3] have logic '1's.

The comparator 113 outputs through the node OUT when the switching signals MRS_ADDR[0] and MRS_ADDR[2] have logic '0's and the switching signals MRS_ADDR[1] and MRS_ADDR[3] have logic '1's.

The comparator 112 outputs through the node OUT when the switching signals MRS_ADDR[1] and MRS_ADDR[3] have logic '0's and the switching signals MRS_ADDR[0] and MRS_ADDR[2] have logic '1's.

The comparator 111 outputs through the node OUT when the switching signals MRS_ADDR[0] and MRS_ADDR[3] have logic '0' and the switching signals MRS_ADDR[1] and MRS_ADDR[2] have logic '1's.

The switching circuits 341, 342, 343, 344, 345 and 346 output logic '0's so that a logic '0' is at the node OUT when switching signals MRS_ADDR[0], MRS_ADDR[1], MRS_ADDR[2] and MRS_ADDR[3] all have logic '0's.

Figure 5:
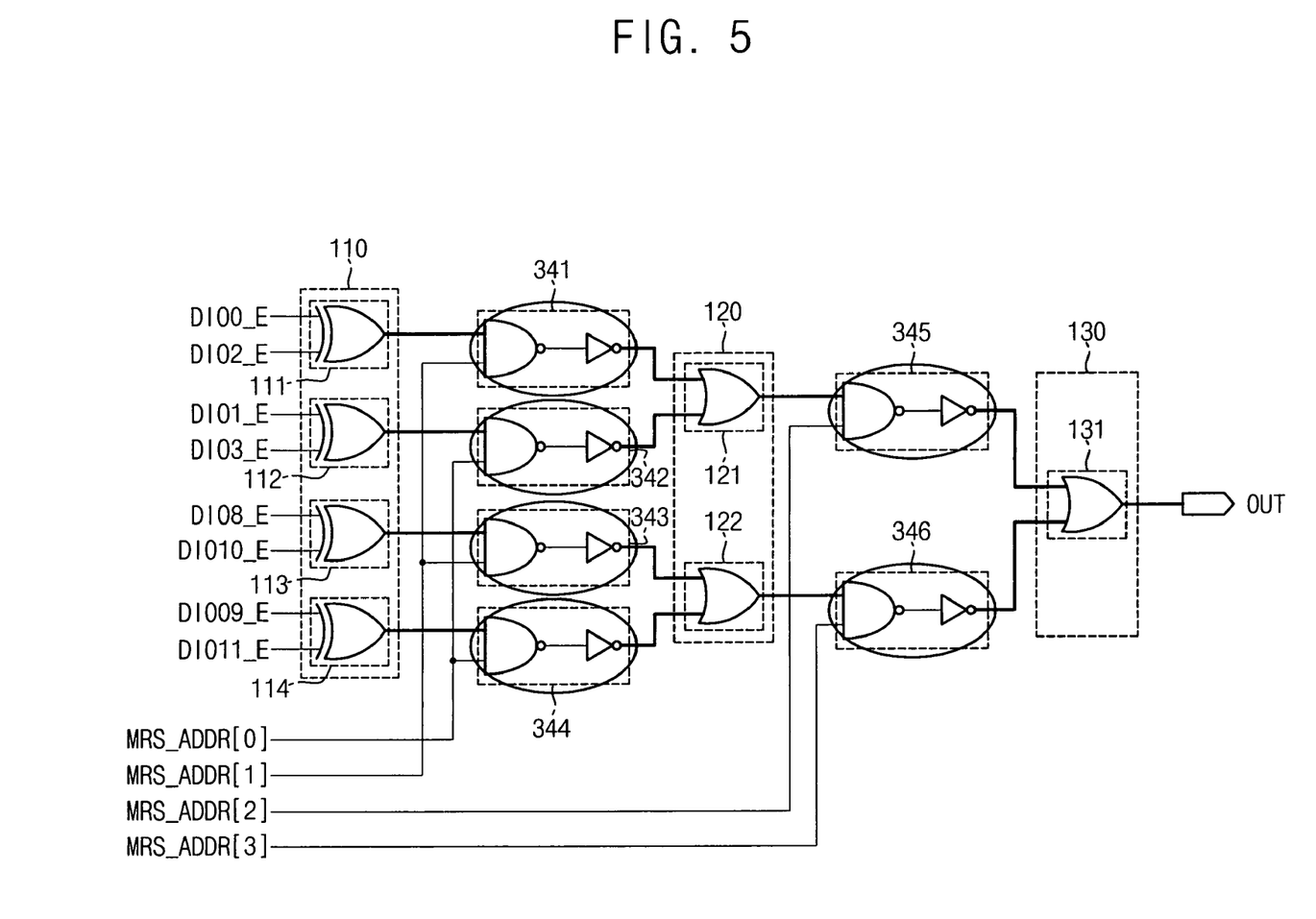
FIG. 5 is a circuit diagram illustrating operation of the parallel bit test circuit in FIG. 3.

FIG. 5 is a circuit diagram illustrating operation of the parallel bit test circuit shown in FIG. 3 where the first row of the table shown in FIG. 4 is input.

The bold lines in FIG. 5 represent the output signal of the comparator 131 at the node OUT when the switching signals MRS_ADDR[0], MRS_ADDR[1], MRS_ADDR[2] and MRS_ADDR[3] all have logic '1's.

The parallel bit test circuit shown in FIG. 5 performs similarly to that of the test circuit shown in FIG. 1, because the switching circuits 341, 342, 343, 344, 345 and 346 output the output signals of the comparators 111, 112, 113, 114, 121 and 122, respectively. Therefore, the test result of the parallel bit test for the eight data read from eight memory cells DIO0_E, DIO2_E, DIO1_E, DIO3_E, DIO8_E, DIO10_E, DIO9_E and DIO11_E is at the node OUT.

Figure 6:
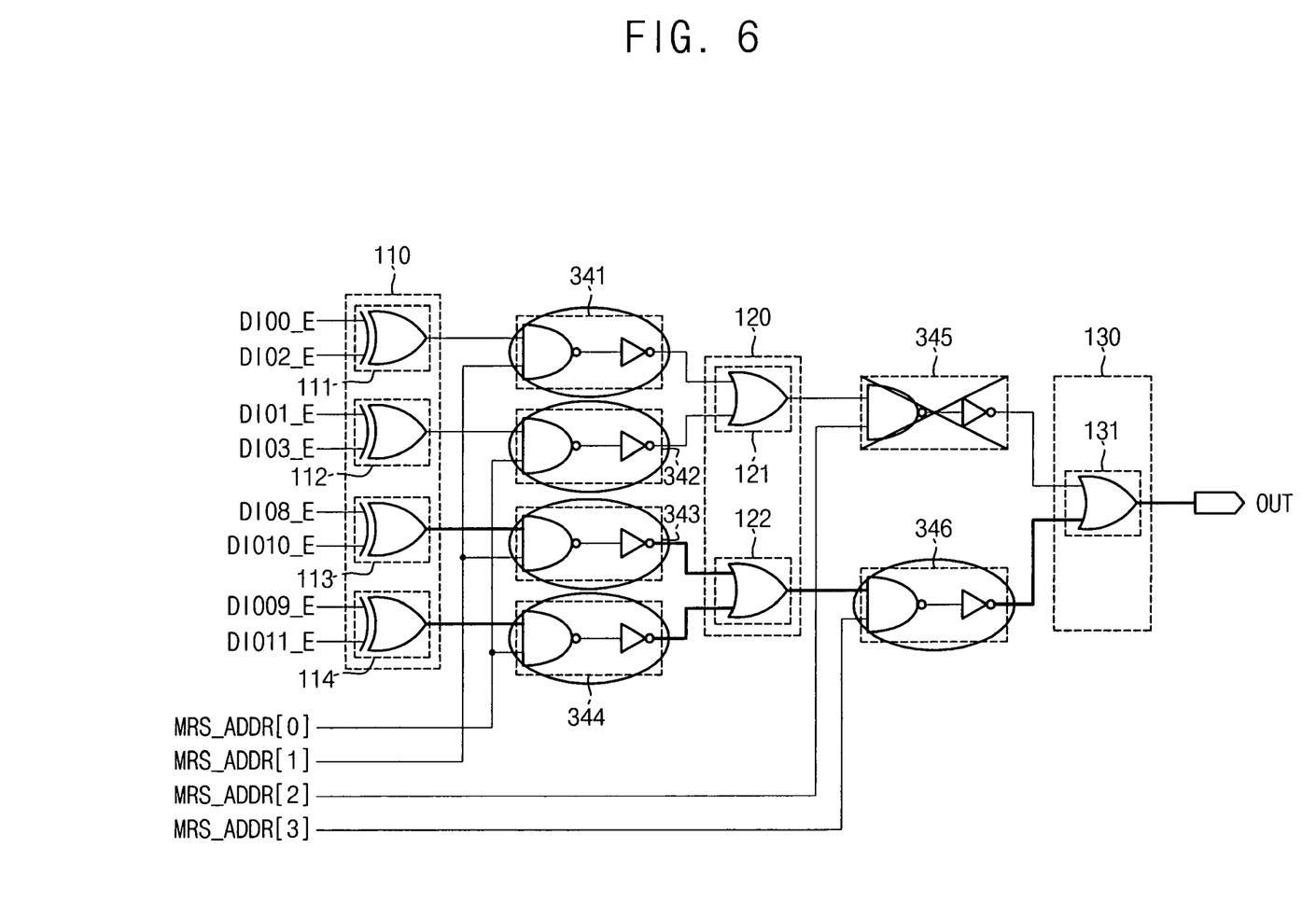
FIG. 6 is a circuit diagram illustrating operation of the parallel bit test circuit shown in FIG. 3.

FIG. 6 is a circuit diagram illustrating operation of the parallel bit test circuit shown in FIG. 3 where the second row of the table shown in FIG. 4 is input.

The bold lines in FIG. 6 represent the output signal of the comparator 122 at the node OUT when the switching signal MRS_ADDR[2] has a logic '0' and the switching signals MRS_ADDR[0], MRS_ADDR[1] and MRS_ADDR[3] have logic '1's.

The switching circuit 345 outputs the disable signal, for example a logic '0', so that the output of the comparator 121 may not affect the comparator 131. The result of the parallel bit test for the four data read from four memory cells DIO8_E, DIO10_E, DIO9_E and DIO11_E is at the node OUT.

Figure 7:
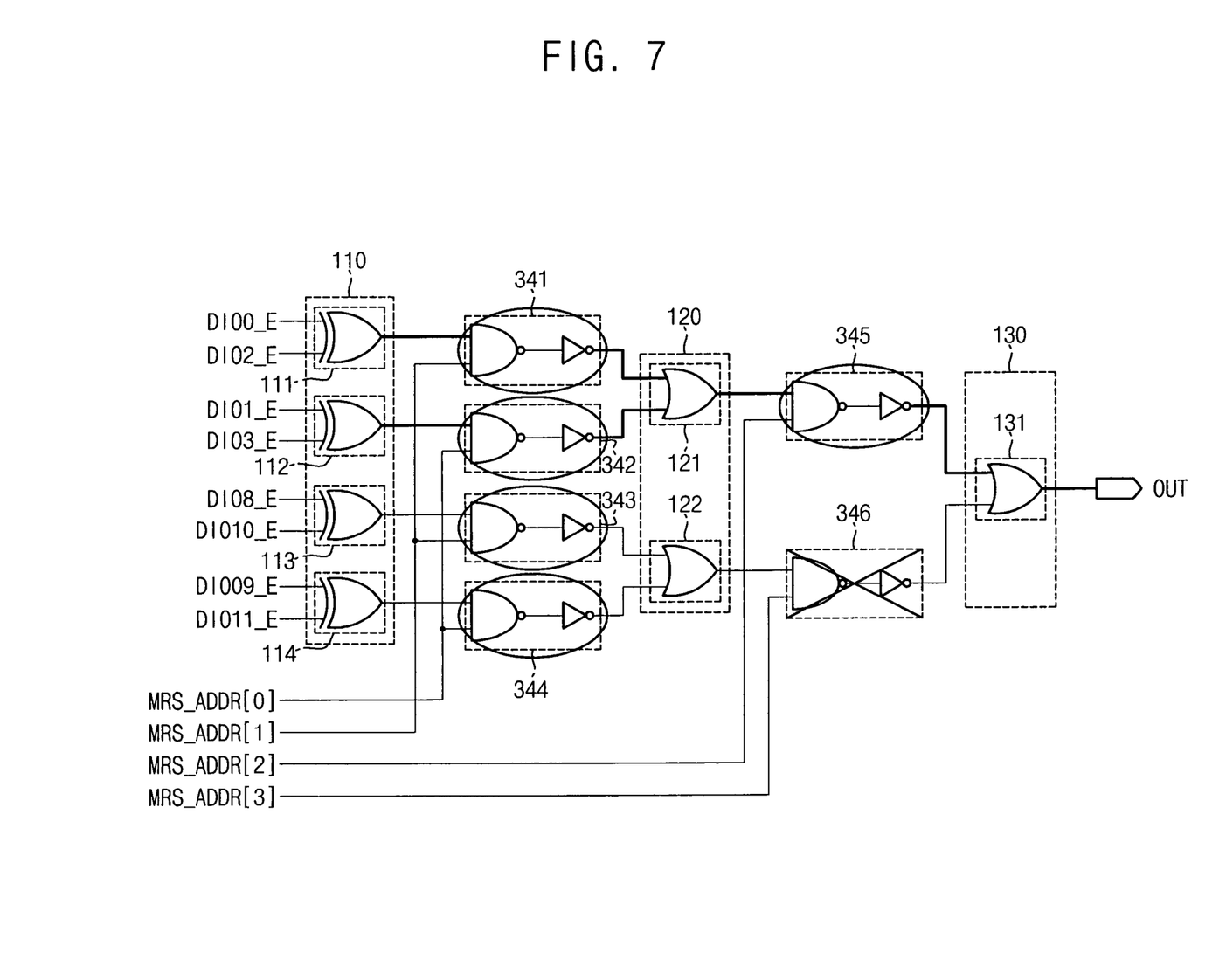
FIG. 7 is a circuit diagram illustrating operation of the parallel bit test circuit shown in FIG. 3.

FIG. 7 is a circuit diagram illustrating operation of the parallel bit test circuit shown in FIG. 3 where the third row of the table shown in FIG. 4 is input.

The bold lines in FIG. 7 represent the output signal of the comparator 121 at the node OUT when the switching signal MRS_ADDR[3] has a logic '0' and the switching signals MRS_ADDR[0], MRS_ADDR[1] and MRS_ADDR[2] have logic '1's.

The switching circuit 346 outputs the disable signal, for example a logic '0', so that the output of the comparator 122 may not affect the comparator 131. The result of the parallel bit test for the four data read from four memory cells DIO0_E, DIO2_E, DIO1_E and DIO3_E is at the node OUT.

Figure 8:
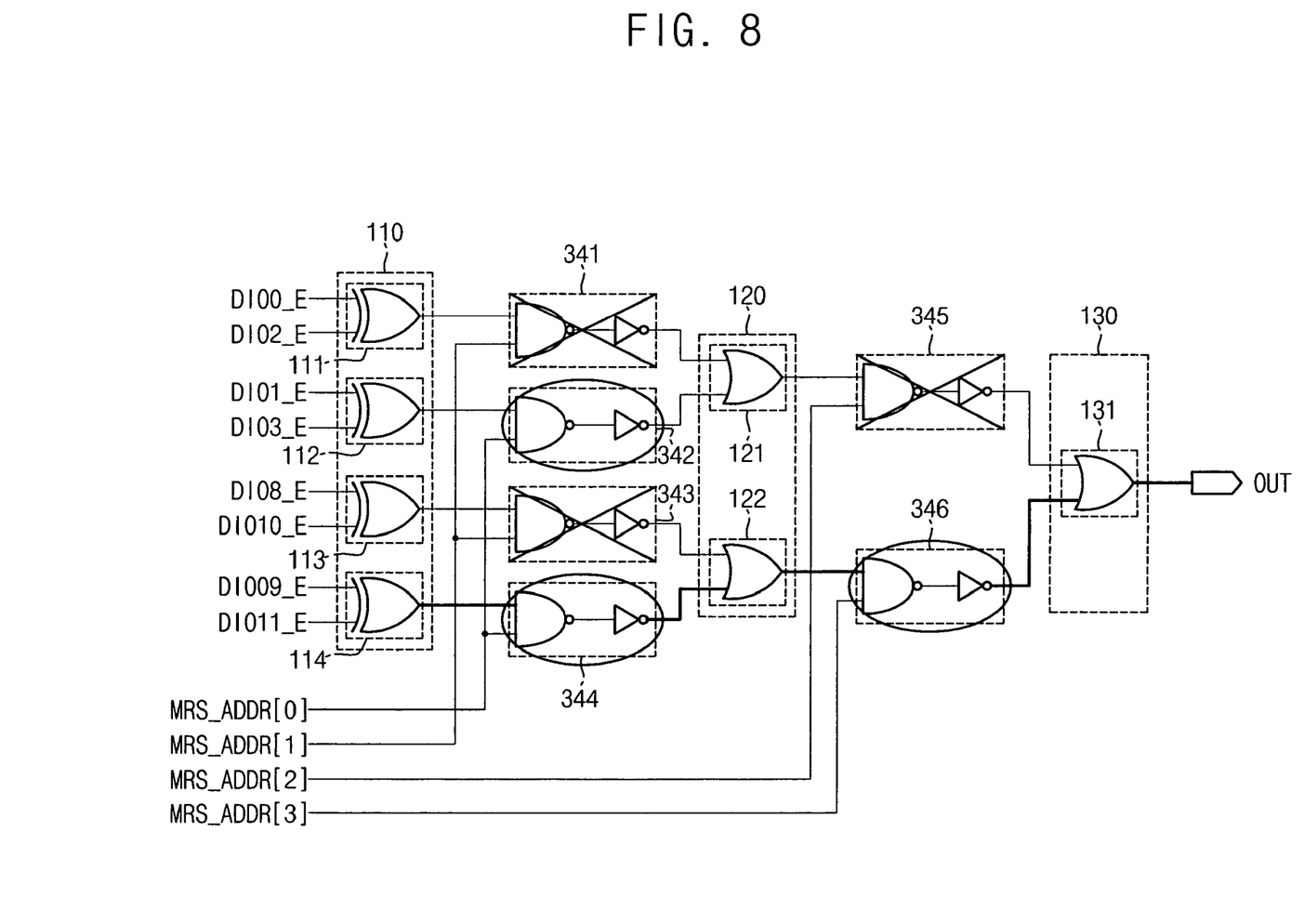
FIG. 8 is a circuit diagram illustrating operation of the parallel bit test circuit shown in FIG. 3.

FIG. 8 is a circuit diagram illustrating operation of the parallel bit test circuit shown in FIG. 3 where the fourth row of the table shown in FIG. 4 is input.

The bold lines in FIG. 8 represent the output signal of the comparator 114 at the node OUT when the switching signals MRS_ADDR[1] and MRS_ADDR[2] have logic '0's and the switching signals MRS_ADDR[0] and MRS_ADDR[3] have logic '1's.

The switching circuits 341, 343 and 345 output the disable signals, for example logic '0's, so that the outputs of the comparators 111, 113 and 121 may not affect the comparators 121, 122 and 131, respectively. The result of the parallel bit test for the two data read from two memory cells DIO9_E and DIO11_E is at the node OUT.

Figure 9:
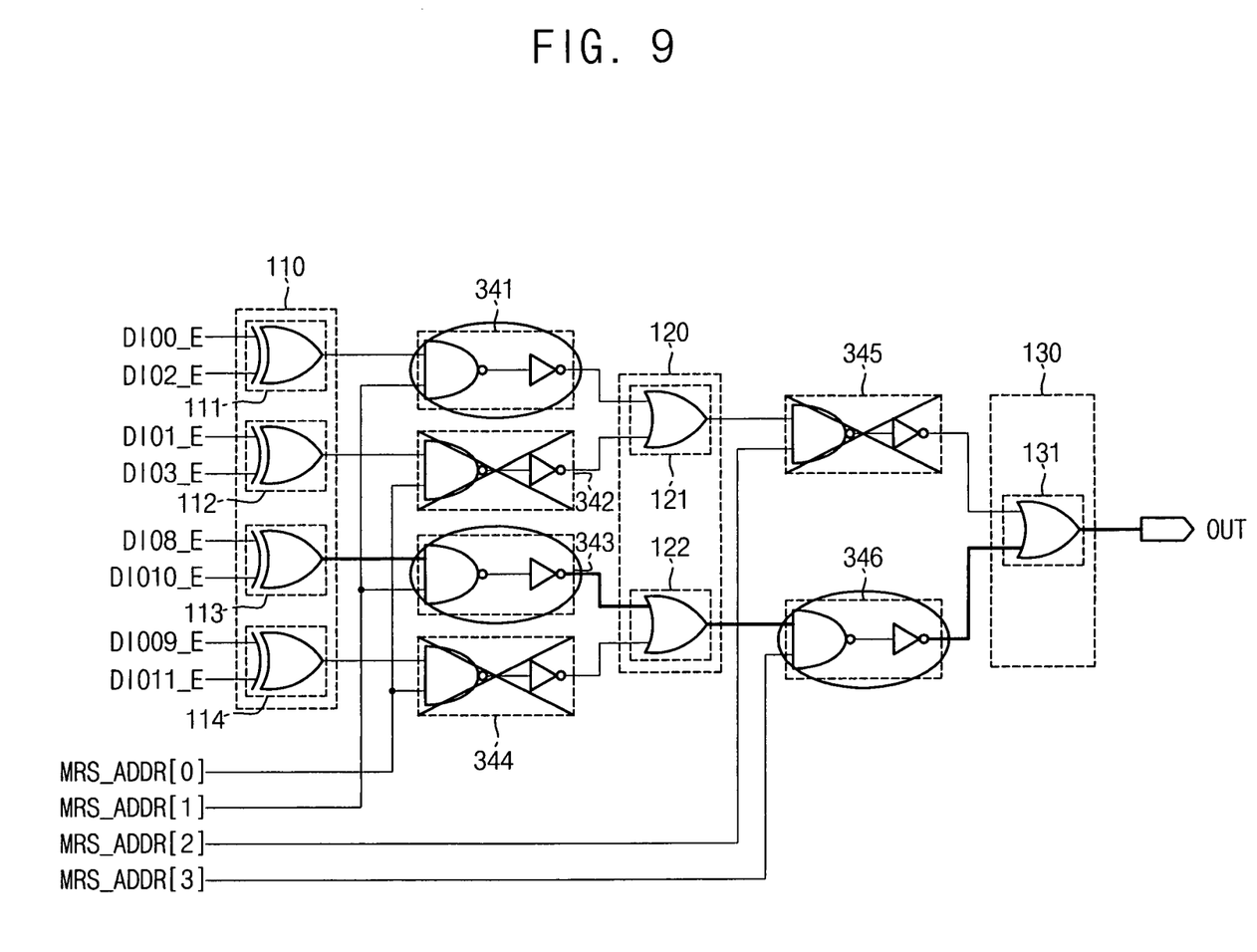
FIG. 9 is a circuit diagram illustrating operation of the parallel bit test circuit shown in FIG. 3.

FIG. 9 is a circuit diagram illustrating operation of the parallel bit test circuit shown in FIG. 3 where the fifth row of the table shown in FIG. 4 is input.

The bold lines in FIG. 9 represent the output signal of the comparator 113 at the node OUT when the switching signals MRS_ADDR[0] and MRS_ADDR[2] have logic '0's and the switching signals MRS_ADDR[1] and MRS_ADDR[3] have logic '1's.

The switching circuits 342, 344 and 345 output the disable signals, for example logic '0's, so that the outputs of the comparators 112, 114 and 121 may not affect the comparators 121, 122 and 131, respectively. The result of the parallel bit test for the two data read from two memory cells DIO8_E and DIO10_E is at the node OUT.

Figure 10:
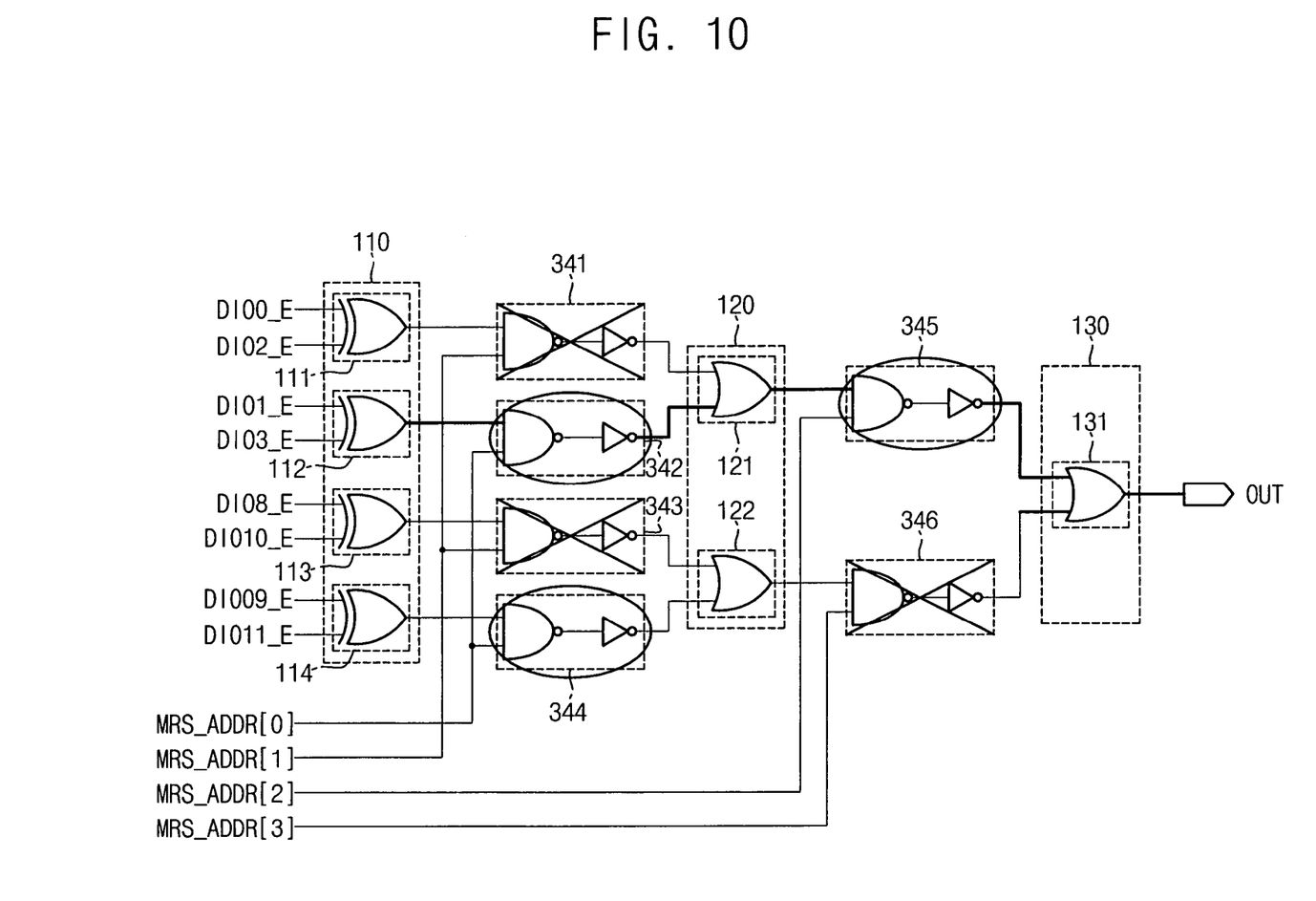
FIG. 10 is a circuit diagram illustrating operation of the parallel bit test circuit shown in FIG. 3.

FIG. 10 is a circuit diagram illustrating operation of the parallel bit test circuit shown in FIG. 3 where the sixth row of the table shown in FIG. 4 is input.

The bold lines in FIG. 10 represent the output signal of the comparator 112 at the node OUT when the switching signals MRS_ADDR[1] and MRS_ADDR[3] have logic '0's and the switching signals MRS_ADDR[0] and MRS_ADDR[2] have logic '1's.

At this time, the switching circuits 341, 343 and 346 output the disable signals, for example logic '0's, so that the outputs of the comparators 111, 113 and 122 may not affect the comparators 121, 122 and 131, respectively. The result of the parallel bit test for the two data read from two memory cells DIO1_E and DIO3_E is at the node OUT.

Figure 11:
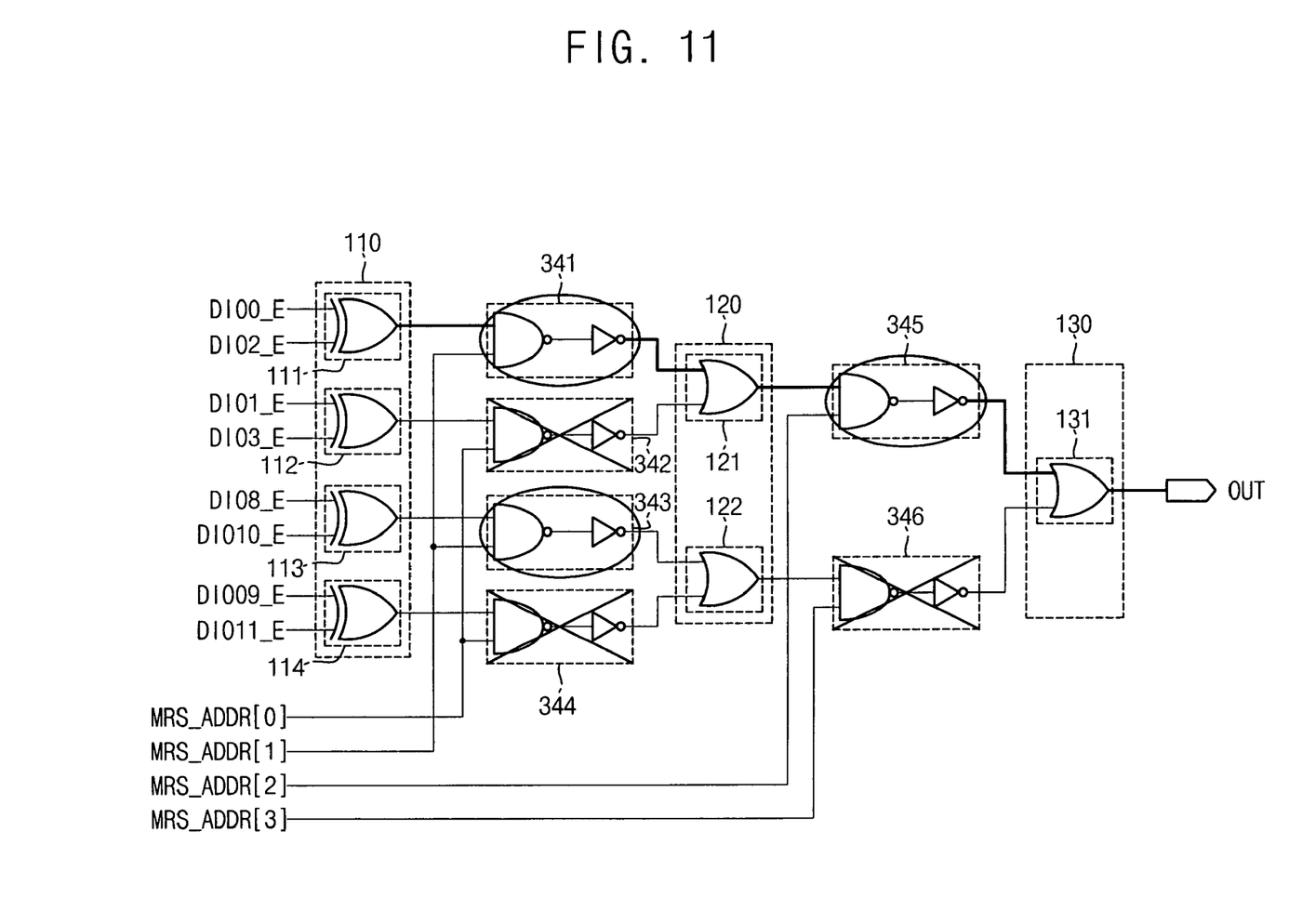
FIG. 11 is a circuit diagram illustrating operation of the parallel bit test circuit shown in FIG. 3.

FIG. 11 is a circuit diagram illustrating operation of the parallel bit test circuit shown in FIG. 3 where the seventh row of the table shown in FIG. 4 is input.

The bold lines in FIG. 11 represent the output signal of the comparator 111 at the node OUT when the switching signals MRS_ADDR[0] and MRS_ADDR[3] have logic '0's and the switching signals MRS_ADDR[1] and MRS_ADDR[2] have logic '1's.

At this time, the switching circuits 342, 344 and 346 output the disable signals, for example logic '0's, so that the outputs of the comparators 112, 114 and 122 may not affect the comparators 121, 122 and 131, respectively. The result of the parallel bit test for the two data read from two memory cells DIO0_E and DIO2_E is at the node OUT.

Figure 12:
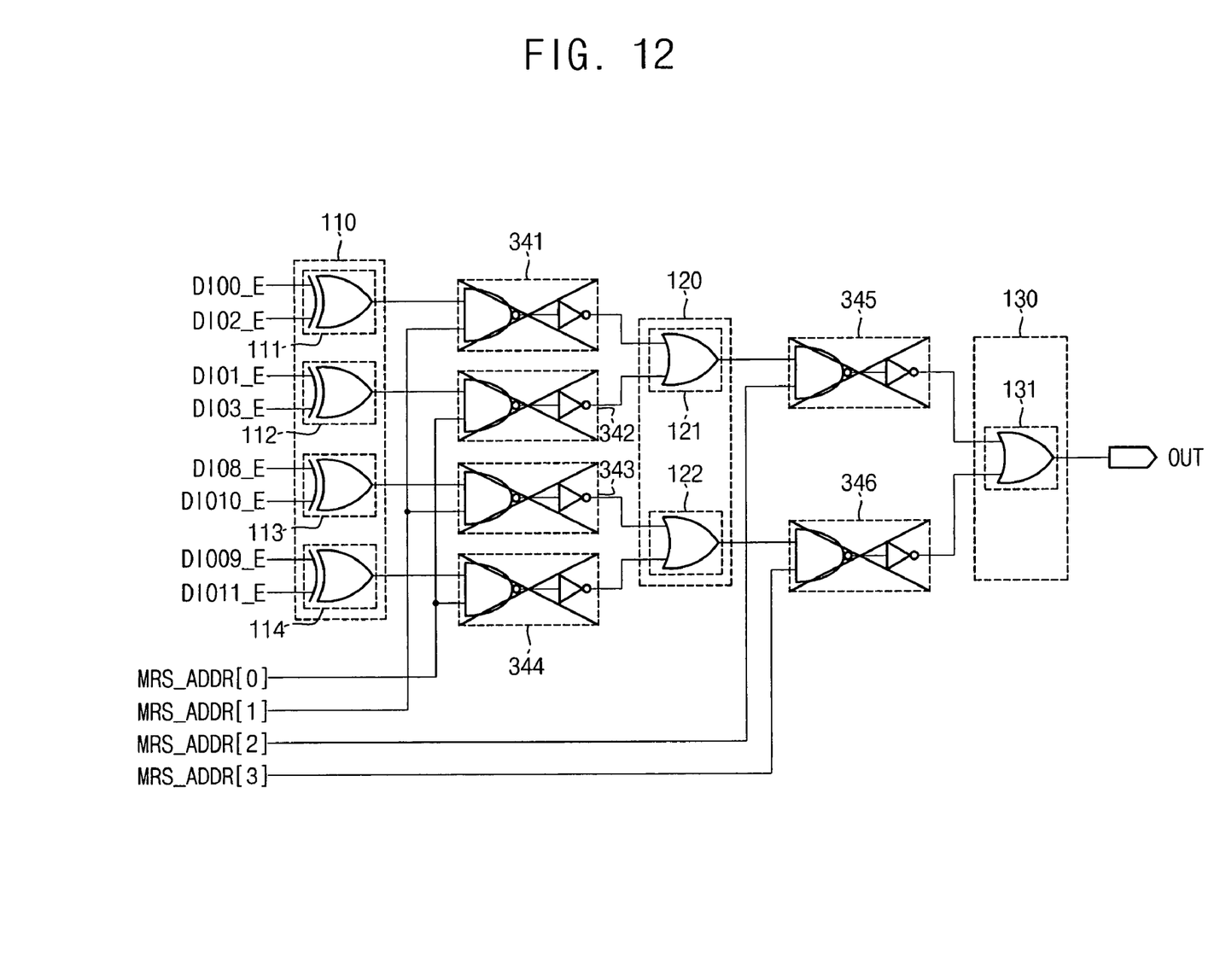
FIG. 12 is a circuit diagram illustrating operation of the parallel bit test circuit shown in FIG. 3.

FIG. 12 is a circuit diagram illustrating operation of the parallel bit test circuit shown in FIG. 3 where the eighth row of the table shown in FIG. 4 is input.

The bold lines in FIG. 12 represent the switching circuits 341, 342, 343, 344, 345 and 346 output as disable signals, for example logic '0's, so that logic '0' is at the node OUT independently of the data read from memory cells DIO0_E, DIO2_E, DIO1_E, DIO3_E, DIO8_E, DIO10_E, DIO9_E and DIO11_E, when the switching signals MRS_ADDR[0], MRS_ADDR[1], MRS_ADDR[2] and MRS_ADDR[3] all have logic '0's. The case of FIG. 12 may be used as a test mode for the switching circuits 341, 342, 343, 344, 345 and 346.

The switching signals MRS_ADDR[0], MRS_ADDR[1], MRS_ADDR[2] and MRS_ADDR[3] may have a partial bit (or partial bits) of a mode register set (MRS) signal.

Consequently, the switching circuits 341, 342, 343, 344, 345 and 346 decide whether the outputs of the comparators 111, 112, 113, 114, 121, 122 are passed to next comparing stages or not. When one of the switching signals MRS_ADDR[0], MRS_ADDR[1], MRS_ADDR[2], and MRS_ADDR[4] has a logic '1', one of the first switching circuits 341, 342, 343, 344, 345 and 346 passes an output of a first comparator of the comparators 111, 112, 113, 114, 121, 122 to next comparing stage. When one of the switching signals MRS_ADDR[0], MRS_ADDR[1], MRS_ADDR[2], and MRS_ADDR[4] has a logic '0', one of the first switching circuits 341, 342, 343, 344, 345 and 346 outputs the disable signal such as a logic '0', so that the output of the first comparator inputted to the first switching circuit may not affect next comparing stages.

Although the above exemplary embodiments discuss a switching circuit implemented by a NAND gate and an inverter, the switching circuit could have any other configurations known to one of the ordinary skill in the art.

The parallel bit test circuit according to the exemplary embodiment of the present invention verifies the output signal of comparators inside the parallel bit test circuit by using internal control signals (i.e., the switching signals) such as a mode register set (MRS) signal for test mode.

The parallel bit test circuit and associated method may use various test patterns because the parallel bit test circuit verifies the output of the comparators inside the parallel bit test.

The parallel bit test circuit and associated method may find which and how many memory cells fail by verifying the output of the comparators inside the parallel bit test circuit when a defect of the memory cell occurs. Therefore, the parallel bit test circuit and associated method may effectively test the memory device and improve the compatibility of parallel bit test.

While the exemplary embodiment of the present invention and their advantages have been described in detail, it should be understood that various changes, substitutions and alterations may be made herein without departing from the scope of the invention.

We claim:

1. A circuit comprising:
    $2^{n-1}$ first comparators to generate a first result by comparing data from at least two of $2^n$ memory cells to which test pattern data are written;
    $2^{n-1}$ first switching circuits to provide the first result or a disable signal responsive to a first switching signal;
    $2^{n-2}$ second comparators to generate a second result by comparing signals output from at least one of the $2^{n-1}$ first switching circuits;
    $2^{n-2}$ second switching circuits to provide the second result or the disable signal responsive to a second switching signal; and
    $2^{n-3}$ third comparators to generate a third result by comparing signals output from at least one of the $2^{n-2}$ second switching circuits;
    where n is a natural number greater than or equal to three.

2. The circuit of claim 1 where the $2^{n-2}$ second comparators generate the second result regardless of the first result of a first switching circuit that outputs the disable signal.

3. The circuit of claim 1 where the $2^{n-3}$ third comparators generate the third result regardless of the second result of a second switching circuit that outputs the disable signal.

4. The circuit of claim 1 where the second switching signal has two bits.

5. The circuit of claim 4 where the first switching signal is configured to operate responsive to a test mode register set signal.

6. The circuit of claim 4 where the second switching signal is configured to operate responsive to a test mode register set signal.

7. The circuit of claim 6 where the first switching circuit includes:
    a first NAND gate; and
    a first inverter serially connected to the first NAND gate.

8. The circuit of claim 7 where the second switching circuit includes:
    a second NAND gate; and
    a second inverter serially connected to the second NAND gate.

9. The circuit of claim 8
    where the first comparator includes a XOR gate; and
    where the second comparator includes an OR gate.

10. The circuit of claim 9 where the third comparator includes an OR gate.

11. The circuit of claim 1 where the first switching signal has two bits.

* * * * *